United States Patent
Rybicki

[11] Patent Number: 6,103,147
[45] Date of Patent: Aug. 15, 2000

[54] METHOD AND APPARATUS FOR MANUFACTURING CURVED GAMMA CAMERA DETECTOR CRYSTALS

[75] Inventor: Al Rybicki, Mentor, Ohio

[73] Assignee: Saint-Gobain Industrial Ceramics, Inc., Worcester, Mass.

[21] Appl. No.: 09/321,290

[22] Filed: May 27, 1999

[51] Int. Cl.[7] .................................................. B29D 11/00
[52] U.S. Cl. .................. 264/1.21; 264/1.23; 264/2.7; 264/157; 264/325; 264/332
[58] Field of Search .................. 264/1.1, 1.23, 264/319, 320, 322, 325, 1.21, 157, 158, 160, 2.7, 332

[56] References Cited

U.S. PATENT DOCUMENTS

| | | |
|---|---|---|
| 3,851,177 | 11/1974 | Van Djik et al. . |
| 3,933,970 | 1/1976 | Rosette et al. . |
| 4,171,400 | 10/1979 | Rosette et al. . |
| 4,429,226 | 1/1984 | Inbar . |
| 5,148,029 | 9/1992 | Persyk et al. . |
| 5,229,613 | 7/1993 | Pandelisev et al. . |
| 5,700,404 | 12/1997 | Berthold .................................. 264/1.23 |
| 5,723,076 | 3/1998 | Ilyukha et al. . |
| 5,792,253 | 8/1998 | Eidelman et al. . |

OTHER PUBLICATIONS

JPNM Physics Web Page, "Gamma Camera Basics," Oct. 2, 1998, p. 1.
Bicron Web Page, "SNM '97 CurvePlate™ Integrated Head Model (Jun. 23, 1997)," Aug. 21, 1998, pp. 1–2.
Bicron Web Page, "CurvePlate Gamma Camera Detector Plate (Sep. 27, 96)," Aug. 21, 1998, p. 1.
Bicron Web Page, "The Role of Detector Plate," Sep. 25, 1998, pp. 1–2.
Bicron Web Page, "Inorganic and Organic Scintillators Differences and Similarities," Oct. 29, 1998, pp. 1–3.
Bicron Web Page, "Nuclear Medicine," Oct. 29, 1998, pp. 1–3.
Bicron Web Page, "CurvePlate™," Sep. 25, 1998, pp. 1–2.
Bicron Web Page, "NaI(pure), NaI(Tl) and Polyscin NaI(TI)," Oct. 29, 1998, pp. 1–4.

*Primary Examiner*—Mathieu D. Vargot
*Attorney, Agent, or Firm*—Volker R. Ulbrich; Donald Bulson

[57] ABSTRACT

An apparatus and methods for manufacturing curved scintillation crystal detector plates uses hot forging of crystal material. Crystal material is brought to a temperature between its plastic temperature and its melting temperature, and it is pressed between a pair of dies having curved pressing surfaces. The heated crystal material may be a freshly-drawn ingot of crystal material, and the method for producing curved plates may include cutting the hot-forged ingot into individual plates.

17 Claims, 3 Drawing Sheets

METHOD AND APPARATUS FOR MANUFACTURING CURVED GAMMA CAMERA DETECTOR CRYSTALS

FIELD OF THE INVENTION

The invention relates to gamma cameras, and more particularly to curved crystal scintillation detector plates and methods for producing such curved plates.

Description of the Related Art

Crystal scintillation detector plates are widely used in nuclear medicine to image tissues containing gamma-emitting tracer compounds (radio-pharmaceuticals) introduced into the patient which selectively accumulate in the region of interest. The gamma quanta (photons) from the patient are incident on the detector plate. The photons interact with the crystal detector plate to produce photons of light—scintillations. For planar imaging and for single photon emission computed tomography (SPECT), a collimator is placed between the patient and the scintillation plate close to the scintillation plate. For positron emission tomography (PET) involving at least two detectors used in coincidence, source location is determined without the need for a collimator.

A matrix of photomultiplier tubes optically coupled to the detector's window detect the scintillations produced in the crystal. The camera system electronics analyzes the relative pulse heights from the photomultiplier tubes to compute the locations of the scintillation events in the crystal and evaluate the corresponding intake of the tracer by the tissue. This information is expressed as an image.

Until recently, gamma cameras for SPECT medical imaging have employed flat crystal detector plates. With flat plates the best spatial resolution occurs at the plate surface which is closest to the organ or structure being imaged. Spatial resolution degrades as the distance increases from the collimator and plate to the body.

Gamma cameras with curved scintillation plates offer improved performance for imaging. With more of the detector plate surface in greater proximity to the body, improved resolution is obtained, which results in improved image quality. In addition, a curved geometry can intercept more of the gamma rays emanating from a given region of the body compared to a flat plate of the same area. This gives advantages in detection efficiency. The curved plate also causes the radiation to be incident on the detector's surface at angles that are more nearly perpendicular to the surface which reduces parallax errors in determining the source location when compared to flat plates.

From the foregoing it is clear that a need exists for curved scintillation plates to be produced.

SUMMARY OF THE INVENTION

The present invention relates to apparatus and methods for manufacturing curved scintillation crystal detector plates by hot forging crystal material. Crystal material is brought to a temperature between its plastic temperature and its melting temperature, and it is pressed between a pair of dies, at least one of which has a curved pressing surface. The heated crystal material may be a freshly-drawn ingot of crystal material, and the method for producing curved plates may include cutting the hot-forged ingot into individual plates.

According to one aspect of the invention, a method of manufacturing a curved scintillation crystal detector plate includes the steps of 1) heating a crystal material to a temperature between its plastic temperature and its melting temperature; and 2) pressing the crystal material between a pair of dies, at least one of which has a curved pressing surface.

According to another aspect of the invention, a scintillation crystal shaper includes a pair of dies each having a curved pressing surface, and a ram for pressing the dies together to reshape a scintillation crystal material therebetween.

According to yet another aspect of the invention, a curved scintillation crystal plate is formed by hot forging a crystal material between curved plates, the crystal material being between its plastic temperature and its melting temperature, so as to transform the crystal material into a polycrystalline material.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
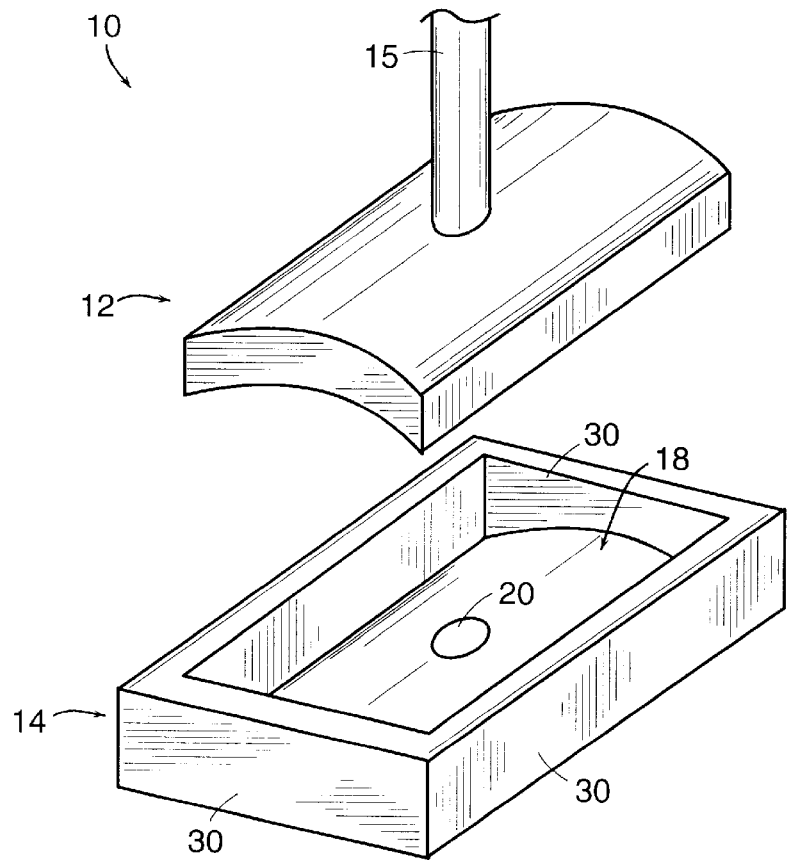
FIG. 1 is a perspective view of a crystal shaper in accordance with the invention.
Figure 2:
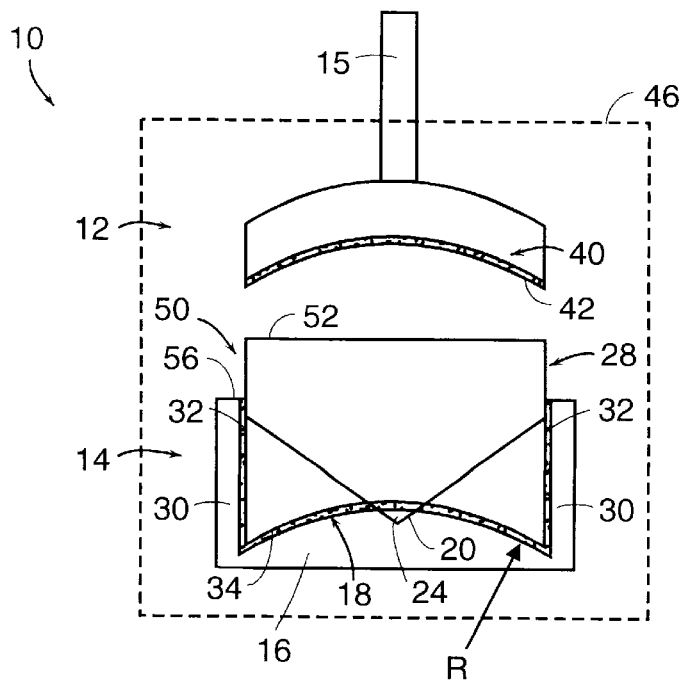
FIG. 2 is a side view of the shaper of FIG. 1.

Referring to the accompanying drawings, and initially to FIGS. 1 and 2, a scintillation crystal shaping apparatus (shaper) 10 is shown. The shaper 10 includes an upper die 12 and a lower die 14. The shaper 10 generally operates by pressing a scintillation crystal material between the dies 12 and 14 while the material is above its plastic temperature. This pressing is accomplished by loading the upper die 12, urging it toward the lower die 14, by use of a ram 15. This pressing causes the crystal material to change its shape to conform to that of surfaces of the dies 12 and 14.

The terms "lower" and "upper", as used herein, refer to the embodiments illustrated in the figures. It will be appreciated that other orientations of the shaper are possible, however.

The lower die 14 has a bottom section 16 which has a lower die pressing surface 18. The lower die pressing surface 18 is curved in a downward direction as shown in FIG. 2. According to one embodiment of the invention the lower die pressing surface has a shape which resembles a section of the outer surface of a cylinder. That is, the lower die pressing surface 18 has a finite, substantially constant radius of curvature R in one direction, and an infinite radius of curvature in a perpendicular direction. The radius of curvature R is preferably between 25 cm and 35 cm and is more preferably between 28 cm and 32 cm, although larger or even smaller curvature radii may be employed. Such radii of curvature are those that have been found to being desirable for the curvature of scintillation detector plates used in medical imaging. However, it will be appreciated that other shapes for the pressing surface (and therefore for the reshaped crystal material) may be utilized. For example, the lower die pressing surface may have a curved shape that has a varying radius of curvature. Alternatively or in addition, the lower die pressing surface may have a shape such that it has finite radii or curvature in both perpendicular directions along the surface.

The bottom section 16 has a depression 20 in lower die pressing surface 18. The depression 20 is suitable for receiving a conical end 24 of an ingot 28 of suitable scintillation crystal material. A function of the depression 20 is to allow the ingot 28 to be centered in the lower die 14. The depression preferably has a conical shape which corresponds to the shape of the conical end 24 of the ingot. Alternatively, it may have another suitable shape, such as a bowl shape. It may alternatively be possible to forego entirely the use of a depression.

The lower die 14 has sidewalls 30 attached to the bottom section 16. The sidewalls 30 function to contain the crystal material as the ingot 28 is reshaped.

The sidewalls 30 are preferably formed with the bottom section 16 as an integral unit. The bottom section 16 and the sidewalls 30 of the lower die 14 are made of steel. It will be appreciated that the bottom section and the sidewalls may alternatively be made of another material suitable for carrying out the invention.

Inner surfaces 32 of the sidewalls 30 and the lower die pressing surface 18 preferably are covered with a layer 34 of graphite foil to prevent sticking of the ingot 28 to the lower die 14. Other materials or coatings which inhibit sticking may alternatively or in addition be used.

The upper die 12 has an upper die pressure surface 40, downwardly curved as shown in FIGS. 1 and 2. The upper die pressure surface 40 preferably has a shape which is substantially matches the shape 1 of the lower die pressure surface 18 of the bottom section 16 of the lower die 14.

The upper die 12 may also be made of steel, with a layer 42 of graphite foil along the upper die pressure surface 40 to prevent sticking of the scintillation crystal material to the upper die 12.

The upper die 12, the lower die 14, and the ingot 28 are located inside a heater or furnace 46. The heater 46 (shown schematically) functions to maintain the ingot 28 at a temperature above its plastic temperature and below its melting temperature. Such heaters and furnaces are well known in the art and need not be described further. The ram 15 will generally be at least partly outside of the heater 46. An insulating material (not shown in FIGS. 1 and 2) may be used to prevent heat loss where the ram passes through the heater.

The heater 46 is illustrated as fully enclosing the lower die 14, the upper die 12, and the ingot 28. However, alternatively the heater may enclose only a part of the shaper 10.

An exemplary scintillation crystal material is thallium-doped sodium iodide. Sodium iodide is in a plastic state at roughly above 300° C. The melting temperature of sodium iodide is 651° C. Thus a sodium iodide crystal would be maintained at a temperature between about 300° C. and 651° C. Preferably the crystal would be maintained between 520 and 570° C. while being reshaped. More preferably a sodium iodide crystal would be maintained between 550 and 570° C. while being reshaped. However, if high strength is desired, the reshaping temperature should generally be lower to produce a stronger material with smaller grains, as described in more detail below.

The ingot 28 has a cylindrical portion 50 with an upper end 52 opposite the conical end 24. The height of the sidewalls 30 of the lower die 14 should be chosen such that top surfaces 56 of the sidewalls 30 are below the upper end 52 of the ingot 28. With the height of the sidewalls 30 thus chosen, some of the scintillation crystal material of the ingot 28 will flow out onto the top surfaces 56 as the ingot 28 is pressed. The presence of this material on the top surfaces 56 will aid in removal of the ingot 28 from the lower die 14 after the ingot has been pressed.

Curved scintillation detector plates may be formed using the shaper 10 by the following method. Prior to shaping, an ingot of scintillation crystal material is grown in a crucible within a crystal growth furnace. The crucible and the ingot are removed from the growth furnace and are moved to a melt out furnace, where the crystal is separated from the crucible. An exemplary thallium-doped sodium iodide ingot has a 22-inch diameter in its cylindrical portion, and weighs approximately 600 pounds.

When the crystal is removed from the melt out furnace, its temperature is generally above its plastic temperature. For example, a sodium iodide crystal may have a temperature of approximately 580° C. to 600° C. when it is removed from the melt out furnace. While it is still hot (still above its plastic temperature), the crystal is put in the lower die 14. The lower die 14 may be pre-heated to reduce thermal shocks and to reduce heat loss from the ingot 28. The conical end 24 of the ingot 28 is situated in the depression 20 in the lower die 14.

The upper die 12 is then brought into contact with the ingot 28. A downward force is applied to the upper die 12 via a ram 15, to re-shape the ingot 28.

The downward force may be applied using a conventional hydraulic forging press which includes a hydraulic cylinder (not shown) supported by two pairs of steel columns which are anchored to a single base casting of great weight and strength. By admitting hydraulic fluid under high pressure to the top of the cylinder, the ram 15 forces the upper die 12 down upon the crystal material to be re-shaped, which rests upon the lower die 14. Small auxiliary cylinders lift the ram after each application of pressure. Additional well-known features of forging presses may be utilized depending on the work to be done by the press, and require no elaboration.

For the exemplary 22-inch diameter crystal ingot described earlier, approximately 180–220 tons of force will be required to re-shape the ingot at a rate of approximately 0.5 mm/hour.

Press-forging of the ingot can have the advantage of strengthening the crystalline material during forging. Press-forging reduces the grain sizes of the crystalline material, and makes the material polycrystalline, with crystal gains having a randomly-oriented mosaic lattice structure. This polycrystalline structure makes the resulting material stronger and better able to withstand mechanical and thermal stress. Scintillation performance is generally unaffected by the polycrystallization—polycrystalline thallium-doped sodium iodide is optically equivalent to single-crystal material.

Press-forging the ingot while it is hot may also have the advantage of providing a more uniform distribution of an activator or other dopant material within the crystal. There is generally a non-uniform distribution of dopants in crystalline materials, for example the distribution of thallium in thallium-doped sodium iodide crystals. The concentration of thallium in such crystals is usually greater at the center of the crystal, and decreases toward the edges of the crystal. Press-forging the entire ingot and the resultant reduction of grain size during cooling of the ingot can result in a more uniform distribution of thallium within the ingot.

The press-forging described above may be used with other scintillation materials. For example, it may be employed with a wide variety of alkali metal halides. However, the above press-forging method may be unsuitable for use with materials that do not have a plastic state.

It will be appreciated that the above apparatus for manufacturing curved crystal plates may also be used for ingots or other masses of crystalline material which have cooled below their plastic temperature before the process is begun. Of course, heating will required to bring such crystalline material above its plastic temperature prior to the reshaping.

Figure 3:
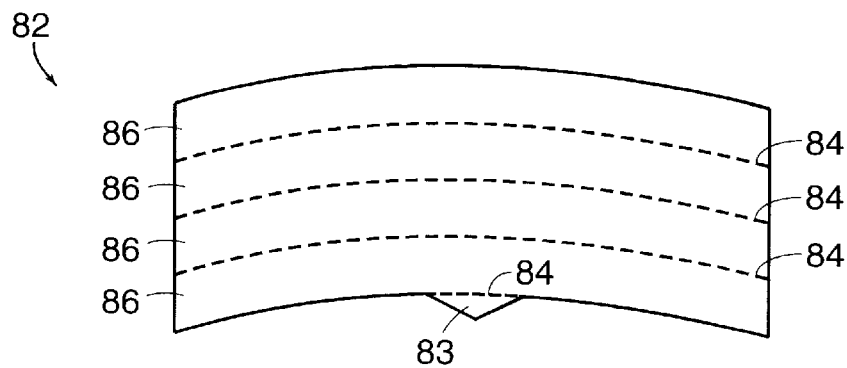
FIG. 3 is side view of an ingot of crystalline material which has been reshaped using the crystal shaper of FIG. 1.

Referring to FIG. 3, a pressed ingot 82 is shown, the pressed ingot 82 having already been removed from the lower die 14. The pressed ingot 82 is cut along cut lines 84, shown in FIG. 3 as dashed lines. The cut lines 84 have substantially the same curvature and are offset from one another by a distance T. By cutting along the cut lines 84 several substantially-identical curved plates 86 are obtained.

The cutting along the cut lines 84 may be accomplished by placing the pressed ingot 82 on a turntable which has a saw at a set distance from the center of rotation of the turntable. It will be appreciated that other means of cutting the pressed ingot at a given radius of curvature may be employed. It will further appreciated the number of plates cut from a single ingot may be a greater or lesser number than that shown.

A conical end piece 88, the part of the ingot which fits in the depression 20 of the lower die 14, is discarded after it is removed in the cutting process or by grinding.

It will be appreciated that as shown and described above, the plates 86 do not have uniform thickness because the cut lines 84 are not parallel to one another, but are rather separated by a set distance in the vertical direction as shown in FIG. 3. Thus in the illustrated embodiment the plates will be thicker in the middle than at the ends. The non-uniformity in thickness may be so small so as to have a negligible effect in performance. However, the non-uniformity in thickness may be reduced or eliminated by grinding or other processing of the plates following the cutting.

Alternatively, the upper and lower dies may be shaped such that their pressure surfaces are substantially parallel, i.e., the upper die pressure surface has a larger radius of curvature than the lower die pressure surface. The cutting of an ingot pressed between such dies may be cut along curved surfaces parallel to upper and lower surfaces of the pressed ingot. The radii of curvature of such cuts would be between the radius of curvature of the upper die pressure surface and that of the lower die pressure surface. Thus the resulting curved plates would each have uniform thickness. However, it will be appreciated that the plates cut from a single pressed ingot would not be identical. They would rather have different curvatures. It will be appreciated that the differences between the curvatures of different plates may have only a negligible effect on performance of a detector using such a plate. Moreover, the cutting could be achieved by using a cutting saw which cuts a constant radius of curvature and appropriately stepping the crystal inward toward the fixed point of the saw radius after each cut to result in cuts of equal radius of curvature and hence plates of uniform thickness. Such techniques would be readily devised by those in the art of cutting crystals.

Figure 4:
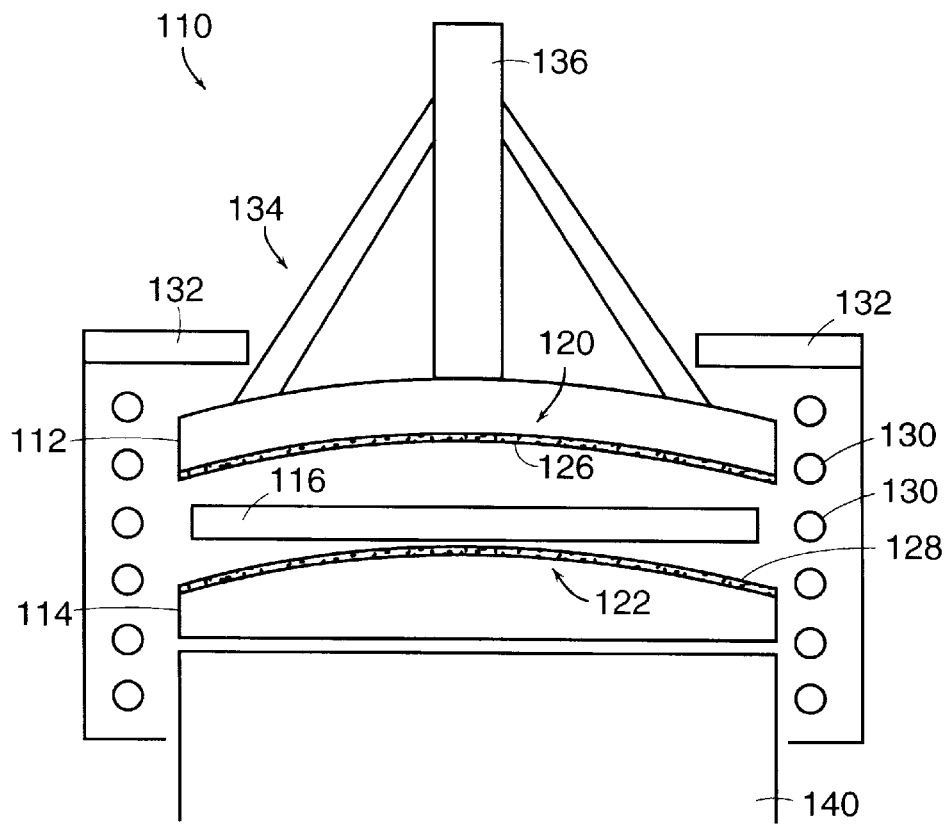
FIG. 4 is a side view of an alternate embodiment crystal shaper in accordance with the invention.

Referring to FIG. 4, an alternate embodiment of the invention is represented by a scintillation crystal shaping apparatus (shaper) 110. The shaper 110 has an upper die 112 and a lower die 114. A scintillation crystal detector plate 116 is placed between the dies 112 and 114, and is re-shaped by press-forging.

The dies 112 and 114 have curved pressing surfaces 120 and 122, respectively. The surfaces 120 and 122 are preferably substantially parallel, having different radii of curvature. They may have the shape described above as a portion of the outer surface of a cylinder, that is each may have a substantially constant radius of curvature in one direction and an infinite radius of curvature in a perpendicular direction. Preferably, the radius of curvature of the upper curved pressing surface 120 is greater than the radius of the lower curved pressing surface 122 by an amount substantially equal to the thickness of the plate 116. With such a difference in the radii of curvature the resulting curved plate has a substantially uniform thickness. However, alternatively the radii of curvature of the pressing surfaces 102 and 122 may be identical, or may differ by an amount other than the thickness of the plate 116. Preferably both dies are curved. However, even even if only one is curved and the other is flat, the benefits of reduced material loss in the cutting of the plate 116 and the benefit of generating polycrystalline material are still obtained, altough the material loss will be greater than if both the dies are curved.

The dies 112 and 114 may be made of steel or another material suitable for carrying out the invention. Graphite coating layers 126 and 128 may be provided on the surfaces 120 and 122, respectively, to prevent the crystal plate 116 from sticking to the dies 112 and 114.

Heaters 130 may be used to heat the crystal plate 116 above its plastic temperature. Existing heaters for performing this function are well-known in the art. The heaters may completely enclose the dies, or alternatively may encircle or be disposed around only part of the combination of the plate and the dies.

Insulating wool 132 is used to reduce heat loss through an upper opening 134 through which a ram 136 passes.

The dies 112 and 114 are placed atop a forge bed 140, which provides support for the forging operation. The ram 136 is then used to press the upper die 112 toward the lower die 114. This pressing causes the crystal plate 116 to be heat forged, reshaping the crystal plate 116 into a curved shape conforming to the surfaces 120 and 122.

The ram 136 may be a hydraulic ram, as described earlier, or may involve any force-producing method suitable for heat forging the crystal 116. The shaper 110 may involve bending a single crystal plate, without appreciably changing the thickness or other dimensions of the plate. Therefore the shaper 110 may require much less force than the shaper 10, which involved reshaping an ingot of crystalline material. For instance, the shaping force may be approximately 200 tons or even less near the end of the bending operation.

A curved crystal detector plate is produced using the shaper 110 by a method similar to that used with the shaper 10. A flat crystal plate 116 is placed, either pre-heated or not pre-heated, into the lower die 114, which also may or may not be pre-heated. The upper die 112 is then placed atop the plate 116.

The crystal plate 116 is heated or maintained at a temperature between its plastic temperature and its melting temperature. Then the ram 136 is used to press the upper die 112 toward the lower die 114.

Figure 5:
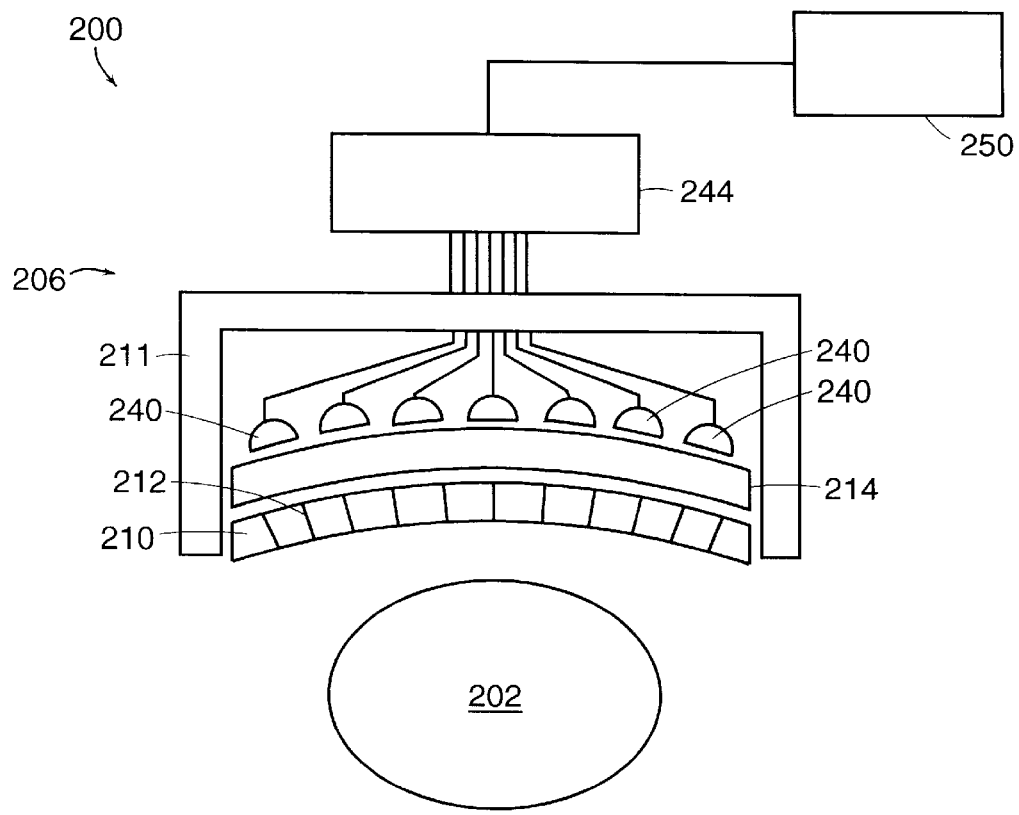
FIG. 5 is a side view of a gamma camera which includes a curved crystal scintillation detector plate in accordance with the invention.

Referring to FIG. 5, a curved crystal detector plate of the present invention is shown as part of an imaging system 200 used for medical imaging of a patient 202.

The imaging system 200 includes a gamma camera 206. Gamma rays emanating from gamma-emitting tracer compounds in the patient 202 enter the gamma camera 206 through a collimator 210. The collimator 210 aids in providing a sharp image by accepting only gamma rays aligned with holes 212 in the columnator 210. A lead housing 211 prevents entry into the gamma camera 206 of gamma rays other than those from the patient 202.

Figure 6:
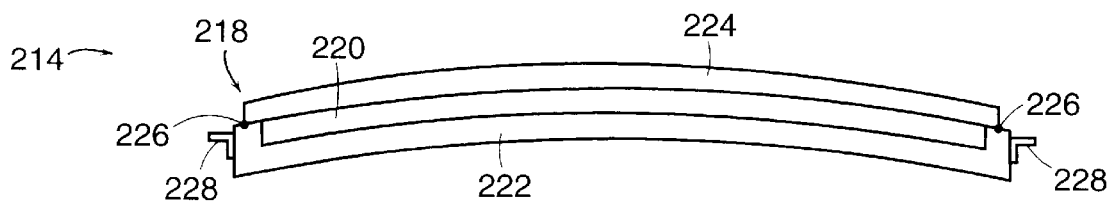
FIG. 6 is a side view of the detector subassembly of the gamma camera of FIG. 5.

Gamma rays that pass through the columnator 210 enter a crystal detector plate subassembly 214. As shown in FIG. 6, the subassembly 214 includes a housing 218 and a curved scintillation crystal detector plate 220. Since scintillation crystals used in gamma cameras are hygroscopic, the housing 218 is hermetically sealed along seal lines 226 to protect the curved plate 220 from moisture. Thus the back cap 222 and the optical window 224 of the housing are durably hermetically sealed using well known means such as epoxy or welding. The housing 218 may also include mounting flanges 228 for mounting the detector subassembly 214 within the gamma camera 206.

Gamma rays pass through the back cap 222 into the detector plate 220. The gamma rays cause the crystal detector plate to scintillate. Light from the scintillation events passes through the optical window 224, which is optically coupled to both the crystal plate 220 and to a series of photo-multiplier tubes (PMTs) 240. The PMTs 240 convert the scintillation light into electrical signals. The PMTs 240 are connected to a computer and electronics 244, which process the signals from the PMTs 240 and output image information which is displayed on a display screen 250.

Although the above description is of curved scintillation crystal plates for use in medical imaging, it will be appreciated that the above methods an apparatus may be utilized for producing curved crystal scintillation plates for a wide variety of applications.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of manufacturing curved scintillation crystal detector plates, comprising the steps of:

heating a crystal material to a temperature between its plastic temperature and its melting temperature;

pressing the crystal material between a pair of dies each having a curved pressing surface and at least one of the dies having side walls for laterally containing the crystal material as the crystal material is reshaped between the dies to form a curved ingot; and cutting the curved ingot to form a plurality of curved plates.

2. The method of claim 1, wherein the pressing includes pressing the crystal material between a pair of curved pressing surfaces having substantially the same curved shape.

3. The method of claim 1, wherein the pressing includes pressing the crystal material between substantially parallel curved pressing surfaces.

4. The method of claim 1, wherein the pressing includes pressing the crystal material between pressing surfaces which each have a substantially uniform radius of curvature in one direction and an infinite radius of curvature in a perpendicular direction.

5. The method of claim 1, wherein the pressing includes pressing the crystal material between pressing surfaces, at least one of which has a substantially uniform radius of curvature in one direction which is between 25 cm and 35 cm.

6. The method of claim 1, wherein the pressing includes pressing the crystal material between graphite-coated curved pressing surfaces.

7. The method of claim 1, wherein the pressing includes using a hydraulic ram to press the dies toward one another.

8. The method of claim 1, wherein the heating includes using a heater to heat the crystal material while it is between the dies.

9. The method of claim 1, wherein the heating includes pre-heating at least one of the dies prior to placing the crystal material between the dies.

10. The method of claim 1, wherein the crystal material is an ingot, and the heating includes heating the crystal material while an ingot of crystal material is being formed.

11. The method of claim 10, wherein one of the dies has a depression in its curved pressing surface, and further comprising placing a portion of the ingot into the depression.

12. The method of claim 1, wherein the crystal material is initially formed as an ingot that is reshaped during pressing.

13. The method of claim 12, wherein the pressing includes pressing the crystal material ingot between concentric pressing surfaces and the cutting includes cutting the curved ingot along a curved path concentric with the curvature of the surfaces.

14. The method of claim 12, wherein the cutting includes sawing the curved ingot.

15. The method of claim 12, wherein the die is pre-heated and further comprising heating the ingot while it is in the die, prior to the pressing.

16. The method of claim 12, wherein the die has a depression in its bottom surface, and the placing includes placing a portion of the ingot in the depression.

17. The method of claim 1, wherein the crystal material is thallium-doped sodium iodide, and the heating includes heating the crystal material to between 520° C. and 570° C.

* * * * *